United States Patent [19]

Brossart

[11] Patent Number: 5,168,345
[45] Date of Patent: Dec. 1, 1992

[54] SEMICONDUCTOR DEVICE HAVING A UNIVERSAL DIE SIZE INNER LEAD LAYOUT

[75] Inventor: Richard Brossart, San Jose, Calif.
[73] Assignee: LSI Logic Corporation, Milpitas, Calif.
[21] Appl. No.: 568,265
[22] Filed: Aug. 15, 1990
[51] Int. Cl.[5] .................... H01L 39/02; H01L 23/48; H01L 23/02
[52] U.S. Cl. .................... 257/668; 257/676; 257/783
[58] Field of Search .......... 357/70, 74, 80, 79

[56] References Cited

U.S. PATENT DOCUMENTS

| | | | |
|---|---|---|---|
| 3,984,860 | 10/1976 | Logue | 357/68 |
| 4,080,512 | 3/1978 | Ramet et al. | 174/68.5 |
| 4,190,855 | 2/1980 | Inoue | 357/80 |
| 4,195,193 | 3/1980 | Grabbe et al. | 174/52 FP |
| 4,258,381 | 3/1981 | Inaba | 357/70 |
| 4,408,218 | 10/1983 | Grabbe | 357/80 |
| 4,771,330 | 9/1988 | Long | 357/80 |
| 4,772,936 | 9/1988 | Reding et al. | 357/80 |
| 4,800,419 | 1/1989 | Long et al. | 357/70 |
| 4,984,059 | 1/1991 | Kubota et al. | 357/70 |
| 4,985,748 | 1/1991 | Belanger, Jr. | 357/80 |
| 5,006,919 | 4/1991 | Disko | 357/70 |

*Primary Examiner*—Andrew J. James
*Assistant Examiner*—Carl Whitehead, Jr.
*Attorney, Agent, or Firm*—Michael D. Rostoker; Gerald E. Linden

[57] ABSTRACT

A substrate includes a non-conductive support layer and a plurality "n" of conductive leads disposed on the support layer. The leads are arranged in a generally radial pattern about a central point on the support layer, each of the leads having a width "w" and spaced a distance "d" from one another at their innermost ends, thereby forming a generally square opening of side dimension "s". The substrate accommodates semiconductor dies ranging in size from smaller than the opening, to approximately equal to that of the opening, to substantially larger than the opening, such as four times the size (linear dimension) of the opening. The die is bonded to the substrate. Other elements of a semiconductor device assembly are added to the resulting structure. Method and apparatus are disclosed.

6 Claims, 5 Drawing Sheets

SEMICONDUCTOR DEVICE HAVING A UNIVERSAL DIE SIZE INNER LEAD LAYOUT

CROSS-REFERENCE TO COPENDING U.S. PATENT APPLICATIONS

Attention is called to commonly-owned, copending U.S. patent application Ser. No. 115,228, entitled METHOD AND MEANS OF FABRICATING A SEMICONDUCTOR DEVICE PACKAGE filed on Oct. 30, 1987 and to commonly-owned, copending U.S. patent application Ser. No. 380,174, entitled STRIP CARRIER FOR INTEGRATED CIRCUITS and filed on Jul. 14, 1989 and to commonly-owned, copending U.S. patent application Ser. No. 454,751, entitled INTERNAL CAPACITOR ARRANGEMENT FOR SEMICONDUCTOR DEVICE ASSEMBLY, filed on Dec. 19, 1989.

Attention is also directed to commonly-owned, copending U.S. patent application Ser. No. 454,751, entitled INTERNAL CAPACITOR ARRANGEMENT FOR SEMICONDUCTOR DEVICE ASSEMBLY, and to U.S. patent application Ser. No. 454,752, entitled HEAT SINK FOR SEMICONDUCTOR DEVICE ASSEMBLY, both filed on Dec. 19, 1989.

Attention is also called to commonly-owned, copending U.S. patent application Ser. No. 543,989, entitled A SEMICONDUCTOR DEVICE PACKAGE AND METHOD OF MAKING SUCH A PACKAGE, filed by Long, Sidorovsky and Steidl on Jun. 25, 1990.

Attention is also directed to commonly-owned, copending U.S. patent application Ser. No. 600,306, entitled INTEGRAL DAM AND HEAT SINK FOR SEMICONDUCTOR DEVICE ASSEMBLY, filed on Oct. 19, 1990 by Patil, Murphy and Newman.

TECHNICAL FIELD OF THE INVENTION

The invention relates to the layout of conductive media, herein referred to as "inner leads", used in semiconductor packages including, but not limited to, ceramic packages, plastic packages, tape packages and fiberglass packages. The inner leads connect the semiconductor die to external package leads.

BACKGROUND OF THE INVENTION

As used herein, the term "semiconductor device" refers to a silicon chip or die containing circuitry, and the term "semiconductor device assembly" refers to the semiconductor chip and associated packaging containing the chip, including leads such as for connecting to a socket or a circuit board, and internal connections, such as bond wires, of the chip to the leads.

Commonly-owned U.S. Pat. No. 4,800,419, entitled SUPPORT ASSEMBLY FOR INTEGRATED CIRCUITS, discloses a composite support assembly for an integrated circuit chip. The support assembly includes a rigid lead frame that is attached to a relatively thin, flexible, tape-like structure. The tape-like structure includes a metallic layer that is etched with inner and outer lead "fingers" allowing for a short pitch, high density arrangement of the lead fingers, thereby enabling bond wires that connect a semiconductor chip to the support assembly to be relatively short. The metallic layer is supported by a segmented plastic film layer, preferably formed of KAPTON (trademark of DuPont Corp.).

Commonly-owned U.S. Pat. No. 4,771,330, entitled WIRE BONDS AND ELECTRICAL CONTACTS OF AN INTEGRATED CIRCUIT DEVICE, discloses an integrated circuit device package including a rigid frame and flexible tape assembly having wire leads between the die attach pad, conductive lead fingers and the integrated circuit (IC) chip. A dam structure prevents resin flow to ensure proper wire bonding.

Commonly-owned, copending U.S. patent application Ser. No. 115,228, entitled METHOD AND MEANS OF FABRICATING A SEMICONDUCTOR DEVICE PACKAGE and filed on Oct. 30, 1987, discloses a semiconductor device assembly having a patterned conductive layer, including a die attach pad and a plurality of leads, and a patterned insulating layer. A semiconductor die is seated on the die attach pad and is connected, such as by bond wires, to the leads. A silicone gel, such as Dow Corning Q1-4939, having a 1 to 10 mixing ratio of curing agent to base, is applied over the bond wires. A body frame, preferably made of a polymer material such as RYTON (trademark of Phillips Chemical Co.) is positioned around the die, and an encapsulant material, such as HYSOL CNB 405-12 (trademark of Hysol) is distributed within the RYTON frame over the semiconductor die and die connections.

Commonly-owned, copending U.S. patent application Ser. No. 380,174, entitled STRIP CARRIER FOR INTEGRATED CIRCUITS and filed on Jul. 14, 1989, discloses a semiconductor device assembly having a patterned conductive layer and a patterned insulating layer, and mounted to a strip carrier providing mechanical rigidity to the semiconductor device assembly during assembly thereof. After assembly, the packaged semiconductor device assembly is excised from the strip carrier.

The aforementioned, commonly-owned patents and applications relate to semiconductor device assemblies having a high lead count. Generally, the inner leads of these devices extend to the periphery of the semiconductor die, and the die is mounted to a die attach pad directly under the die. In the case of wire bonding the die to the inner leads, the inner leads extend only nearly to the four peripheral edges of the typically square die. In other words, the inner leads are directed to a central point, directly under the die, but stop short thereof—the innermost ends of the inner leads defining a square "cavity" locating and containing the die and, where there is one, a die attach pad. In the case of TAB (Tape Automated Bonding) the die to the inner leads, the inner leads extend uniformly just inside the peripheral edges of the die. In the main hereinafter, wire bonding is discussed.

The inner leads "fan out" from their innermost ends, adjacent the die attach pad. Typical dimensions for the inner leads are 2½ mils (thousandths of an inch) wide, with an spacing of 4 mils between adjacent leads at their innermost ends.

In the prior art, multiple cavity sizes of leadframes were required to accommodate a broad range of die sizes. Further, die attach pads were commonly used. However, the technology is evolving towards the use of tape-based substrates, versus lead frames, and towards the use of epoxy-based die attach techniques not requiring a die attach pad.

U.S. Pat. No. 4,195,193 discloses a lead frame and chip carrier housing. Therein is disclosed a lead frame having a central support portion and leads extending from the support portion in all directions. FIG. 2 shows the basic lead frame, and FIGS. 3-5 show how chips of varying sizes and requiring varying numbers of leads can be accommodated by the lead frame. Generally, only some of the leads extend all the way to the support portion, and the remaining leads terminate increasingly further away from the support portion in a symmetrical radiating pattern. According to the size of the die, and the number of connections to be made, the central support portion (including the ends of the longest leads) is removed, the chip is placed in the resulting square opening (which is at least as large as the die), and the die is connected to those leads extending to the opening. Hence, the larger the opening in the center of the lead frame is made, the greater number of leads become available for connection to the die.

U.S. Pat. No. 4,190,855 discloses installation of a semiconductor chip on a glass substrate. A flipchip LSI (3) is mounted on a glass substrate (1) having a wiring pattern (2). The wiring pattern extends, evidently, to a fixed distance just inside the perimeter of the flipchip so that solder (4) connections can be made between attachment points about the perimeter of the flipchip (3) and the inner ends of the conductors (2).

U.S. Pat. No. 4,258,381 discloses a lead frame for a semiconductor device suitable for mass production. Therein is disclosed a lead frame assembly having an "island" (5) at its center portion for mounting a semiconductor chip, and leads (7) positioned around the island for completing to electrical connection with external circuits. The chip is wire bonded to the leads in a normal manner.

U.S. Pat. No. 4,772,936 discloses a pre-testable double-sided TAB design. Therein is disclosed a flip-chip device (150) having solder bumps (122') mounted to a tape (110) having leads (120) crossing gaps (130) in the tape to positions underneath the device (150). The flip-chip device (150) is mounted without a die attach pad.

Attention is also directed to U.S. Pat. No. 3,984,860, which discloses multi-function LSI wafers, and to U.S. Pat. No. 4,080,512, which discloses a substrate for integrated circuit.

DISCLOSURE OF THE INVENTION

It is therefore an object of the present invention to provide an inner lead layout for semiconductor packages that can accommodate a broad range of die sizes.

It is a further object of the present invention to extend the inner leads as far as possible to a point directly under the center of the die, without electrically shorting the leads.

It is a further object of the present invention to provide an inner lead layout for a semiconductor package which will allow one semiconductor package to accommodate different die sizes.

It is a further object of the present invention to provide a technique of forming a semiconductor device assembly wherein various die sizes can be used with a single substrate configuration.

As used herein, the term "substrate" is used to indicate the combination of inner leads of a semiconductor device assembly and the support layer upon which they are supported.

According to the invention, a substrate includes a nonconductive support layer and a plurality "n" of conductive leads disposed on the support layer. The leads are arranged in a generally radial pattern about a central point on the support layer, each of the leads having a width "w" and spaced a distance "d" from one another at their innermost ends, thereby forming a generally square opening of side dimension "s". The substrate accommodates semiconductor dies ranging in size from smaller than the opening, to approximately equal to that of the opening, to substantially larger than the opening, such as four times the size (linear dimension) of the opening. The die is bonded to the substrate. Other elements of a semiconductor device assembly are added to the resulting structure.

The die can be smaller than the opening by up to approximately 125-150 mils, which is the maximum practical length for a bond wire.

By having a standardized package that will accommodate a broad range of die sizes, inventories will be reduced, manufacturing logistics will be simplified, design libraries and logistics will be simplified, and manufacturing costs will be lowered.

Other objects, features and advantages of the invention will become apparent in light of the following description thereof.

Hereinafter, three exemplary die sizes are discussed—"large", "medium" and "small". By way of example, the small die measures 100 mils on a side, the medium die is twice as large (four times the surface area) and measures 200 mils on a side, and the large die is four times as large (sixteen times the area of the small die) and measures 400 mils on a side. The inner lead layout of the present invention is applicable to a broad range of die sizes.

Figure 3A:
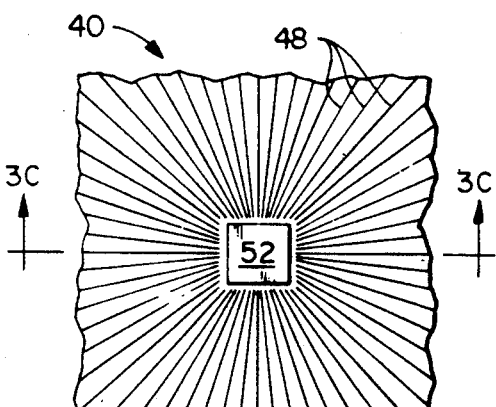

FIG. 3A is a plan view of the inner lead layout of the present invention, with a small die.

Figure 3B:
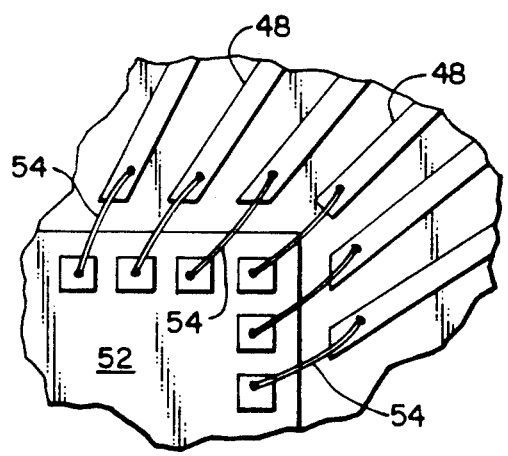

FIG. 3B is a more detailed view of the inner lead layout of FIG. 3A.

Figure 3C:
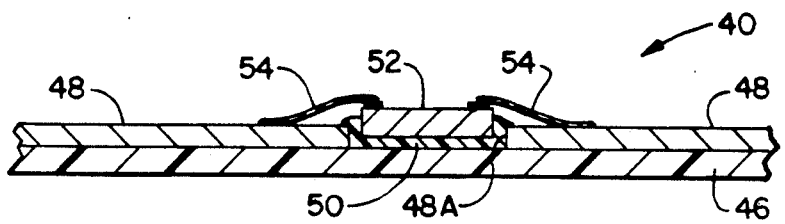

FIG. 3C is a cross-sectional view of the inner lead layout of FIG. 3A.

Figure 4A:
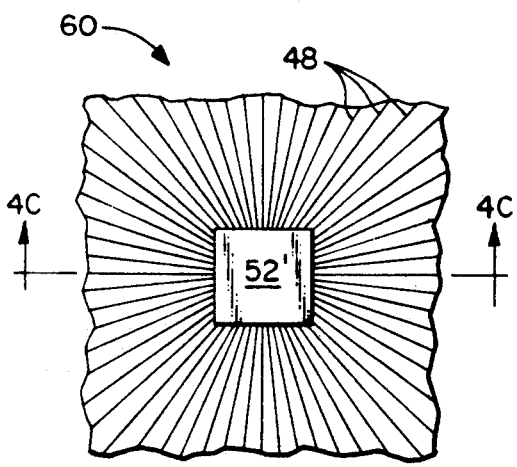

FIG. 4A is a plan view of the inner lead layout of the present invention, with a medium die.

Figure 4B:
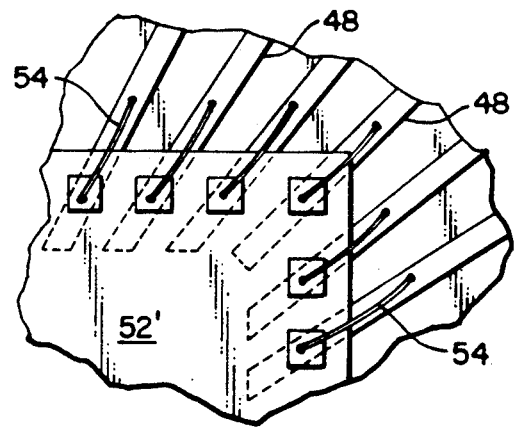

FIG. 4B is a more detailed view of the inner lead layout of FIG. 4A.

Figure 4C:
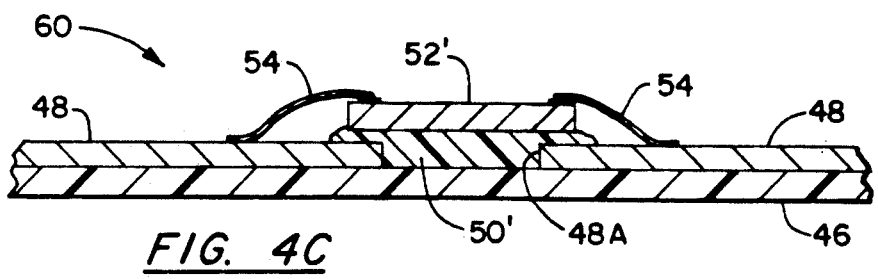

FIG. 4C is a cross-sectional view of the inner lead layout of FIG. 4A.

Figure 5A:
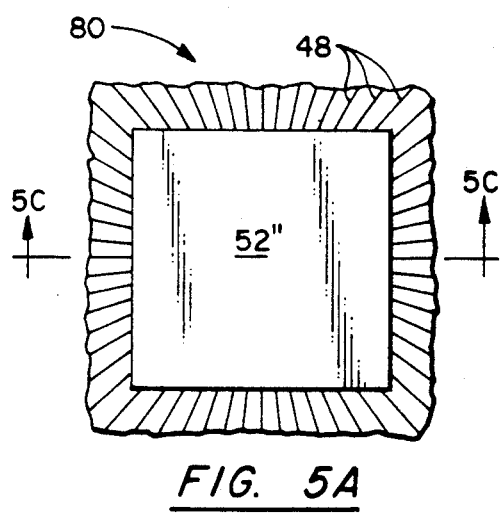

FIG. 5A is a plan view of the inner lead layout of the present invention, with a large die.

Figure 5B:
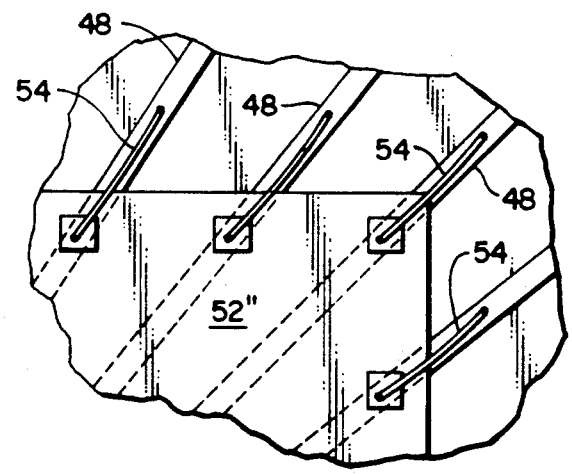

FIG. 5B is a more detailed view of the inner lead layout of FIG. 5A.

Figure 5C:
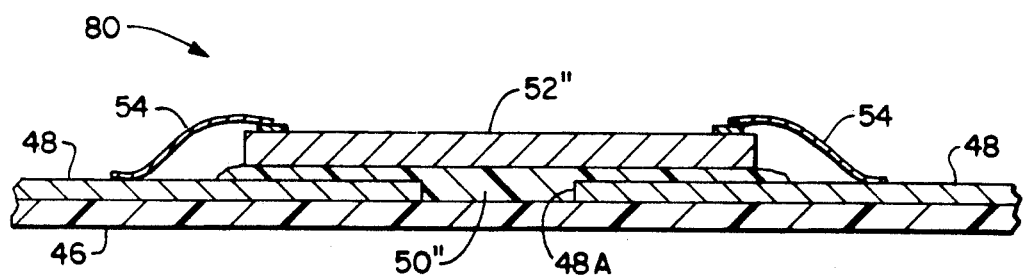

FIG. 5C is a cross-sectional view of the inner lead layout of FIG. 5A.

DETAILED DESCRIPTION OF THE INVENTION

Figure 1A:
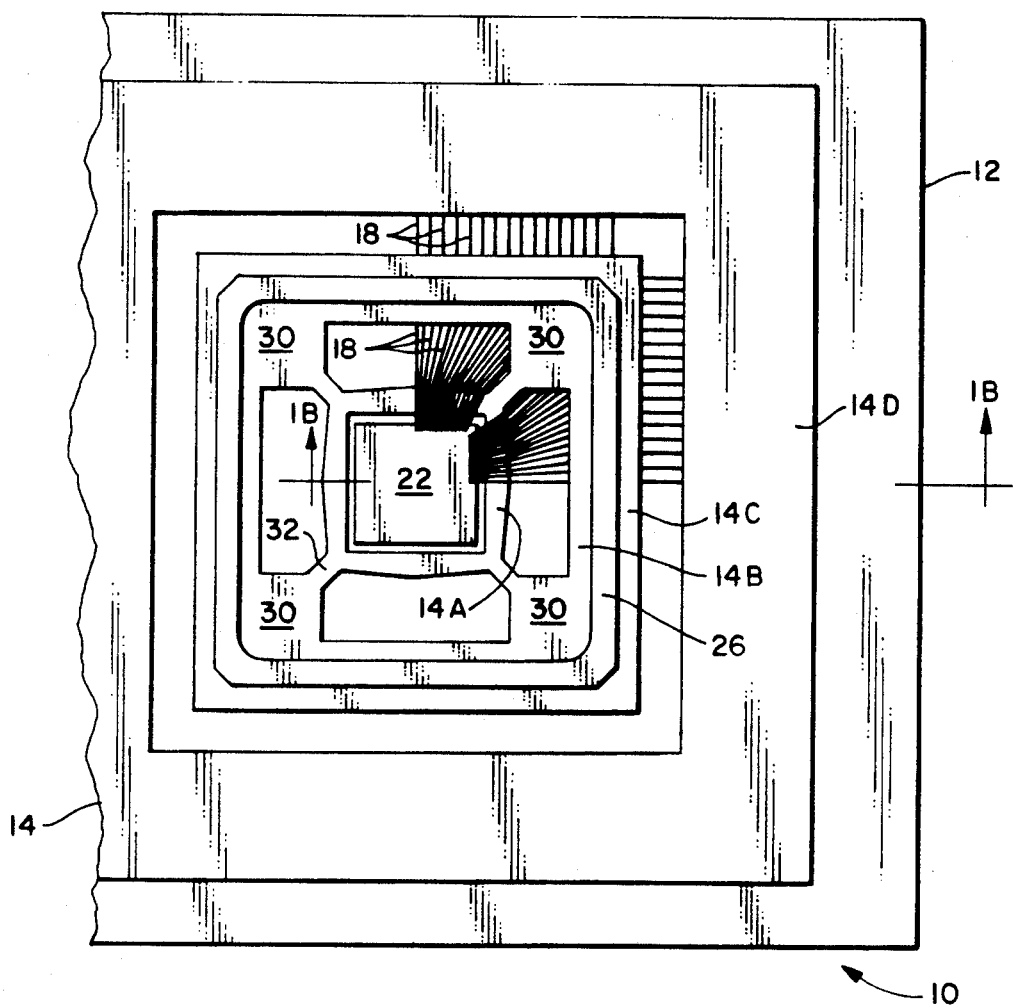
FIG. 1A is a top plan view of a semiconductor device assembly, such as is disclosed in the aforementioned commonly-owned, copending U.S. patent application Ser. No. 380,174.
Figure 1B:
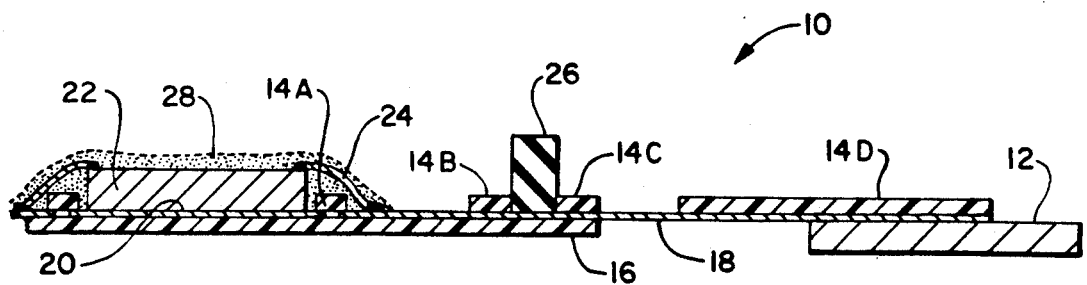
FIG. 1B is a partial cross-sectional view of the semiconductor device assembly of FIG. 1A, taken on the line 1B—1B.
Figure 1C:
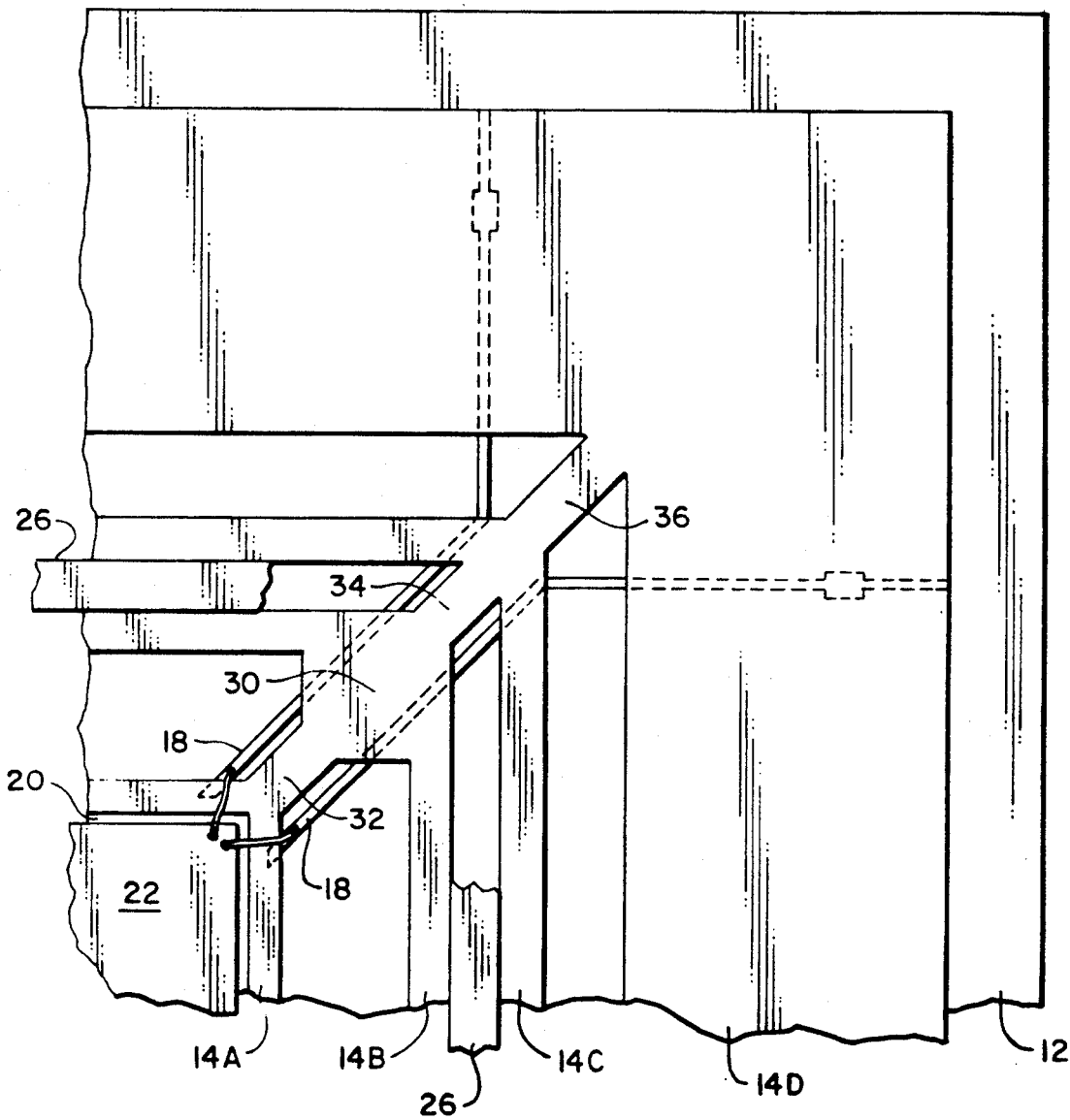
FIG. 1C is a more detailed, partial top plan view of the semiconductor device assembly of FIG. 1A.

FIGS. 1A, 1B and 1C show a semiconductor device assembly 10. Generally, as disclosed in the aforementioned, commonly-owned, copending U.S. patent application Ser. No. 380,174, the semiconductor device assembly 10 includes an upper, segmented plastic film layer 14 (formed of segments 14A, 14B, 14C and 14D), a lower plastic film layer 16, metallic leads 18 sandwiched between the two plastic layers 14 and 16, a metallic (preferably copper) die attach pad 20 supported between the two plastic layers 14 and 16, a semiconductor device 22 mounted on the die attach pad 20 and bond leads 24 connecting the semiconductor device 22 to the leads 18.

As disclosed in the aforementioned U.S. patent application Ser. No. 115,228, in lieu of employing bond wires 24, conductive bumps may be employed to provide a conductive path from the device 22 to the leads 18 in a tape automated bonding (TAB) process.

More particularly, the semiconductor device assembly 10 is formed as follows. The upper plastic layer 14 does not form a continuous surface, but rather is segmented to include an inner (typically square) ring portion 14A, in intermediate (typically square) ring portion 14B disposed outside of the inner ring portion, an outer (typically square) ring portion 14C disposed outside of the intermediate ring portion and an exterior (typically square) ring portion 14D disposed outside of the outer ring portion. The upper plastic layer 14 is preferably formed of KAPTON, and forms a thin, insulating supportive structure for the leads 18. In a region between the inner and intermediate ring portions 14A and 14B, respectively, "inner" portions of the leads 18 are very closely spaced. In a region between the intermediate and exterior ring portions 14B and 14D, respectively, "outer" portions of the leads 18 are more spread out. The inside periphery of the inner ring portion 14A supports the outside periphery of the die attach pad 20, and the outside periphery of the inner ring portion 14A supports the innermost ends of the leads 18, in essence forming a "bridge" between the die attach pad and the leads.

A rubber-like or plastic-like (typically square) ring ("body frame" or "dam") 26 is disposed atop the leads 18 between the intermediate ring portion 14B and the outer ring portion 14C. The ring 26 is preferably formed of RYTON, and is joined to the leads 18 by an adhesive, such as a B-stage adhesive such as RT-4B (trademark of RJR Polymers). The dam 26 can also be metallic, such as anodized aluminum, bonded to the substrate (leads 18 and lower layer 16).

As shown, a layer-like quantity of silicone gel 28, such as Dow Corning Q1-4939, having a 1 to 10 mixing ratio of curing agent to base, encapsulates the leads 24. The quantity of silicone gel acts as a moisture barrier and a stress relief for the leads 24 during assembly of the semiconductor device assembly, and further prevents an ultimate encapsulation epoxy ( not shown in FIGS. 1A, 1B and 1C, shown as elements 60 and 94 in FIGS. 2 and 3, respectively) from contacting the semiconductor die. Surface tension between the silicone gel and the leads 24 keeps the silicone gel in place around the leads during assembly of the semiconductor device assembly. The lower plastic layer 16 covers the bottom of the die attach pad 20, and extends generally over the entire area described by the outer ring portion 14C, on the opposite side of the leads 18 and die attach pad 20. The lower plastic layer 16 is preferably formed of KAPTON.

As disclosed in the aforementioned U.S. patent application Ser. No. 380,174, a surrogate lead frame (edge ring) 12 is provided for handling the semiconductor device assembly during manufacture thereof, and shorts the outer ends of the leads 18 to facilitate electroplating.

Further, the semiconductor device assembly is encapsulated with epoxy extending over the semiconductor device 22, bond leads 24 (including the silicone gel layer 28) and inner and intermediate ring portions 14A and 14B, respectively, up to the RYTON ring 26 and filling the cavity defined by the RYTON ring. Further, after completion of the manufacturing process the semiconductor device assembly is excised from the lead frame 12 and exterior ring portion 14D, neither of which properly form any part of the ultimate semiconductor device assembly 10. The RYTON ring 26 also prevents the intermediate KAPTON ring portion 14B from "wicking" moisture into the semiconductor device assembly.

With particular reference to FIG. 1C, it is evident that the four corner sections of the intermediate ring portion 14B each extend inwardly toward the inner ring portion 14A, forming a square KAPTON "pad" 30. Further, at each of the four corners of the inner ring portion, a first KAPTON "bridge" 32 is formed connecting the inner ring portion 14A to the intermediate ring portion 14B at a pad 30. Further, at each of the four corners of the intermediate ring portion 14B, a second KAPTON bridge 34 is formed connecting the intermediate ring portion 14B to the outer ring portion 14C. Further, at each of the four corners of the outer ring portion 14C, a third KAPTON bridge 36 is formed connecting the outer ring portion 14C to the exterior ring portion 14D. Ultimately, the second and third KAPTON bridges 34 and 36 may be excised from the semiconductor device assembly, as is illustrated in FIG. 1A.

With particular attention to FIG. 1C, the spacing of the leads 18 is very compact in a region between the intermediate ring 14B and the die attach pad 20. In this area, the leads are particularly referred to as "inner leads". The innermost ends of the inner leads are very visible in this view, and (as is more evident in FIGS. 1A and 2A) it is seen that their ends form a generally square opening within which the semiconductor die 22 is placed for connection to the inner leads.

The semiconductor device assembly of FIGS. 1A, 1B and 1C is representative of the prior art insofar as it discloses that the leads 18 extend to the periphery of the die attach pad 22 (separated therefrom by a small gap bridged by the inner ring 14A).

Figure 2A:
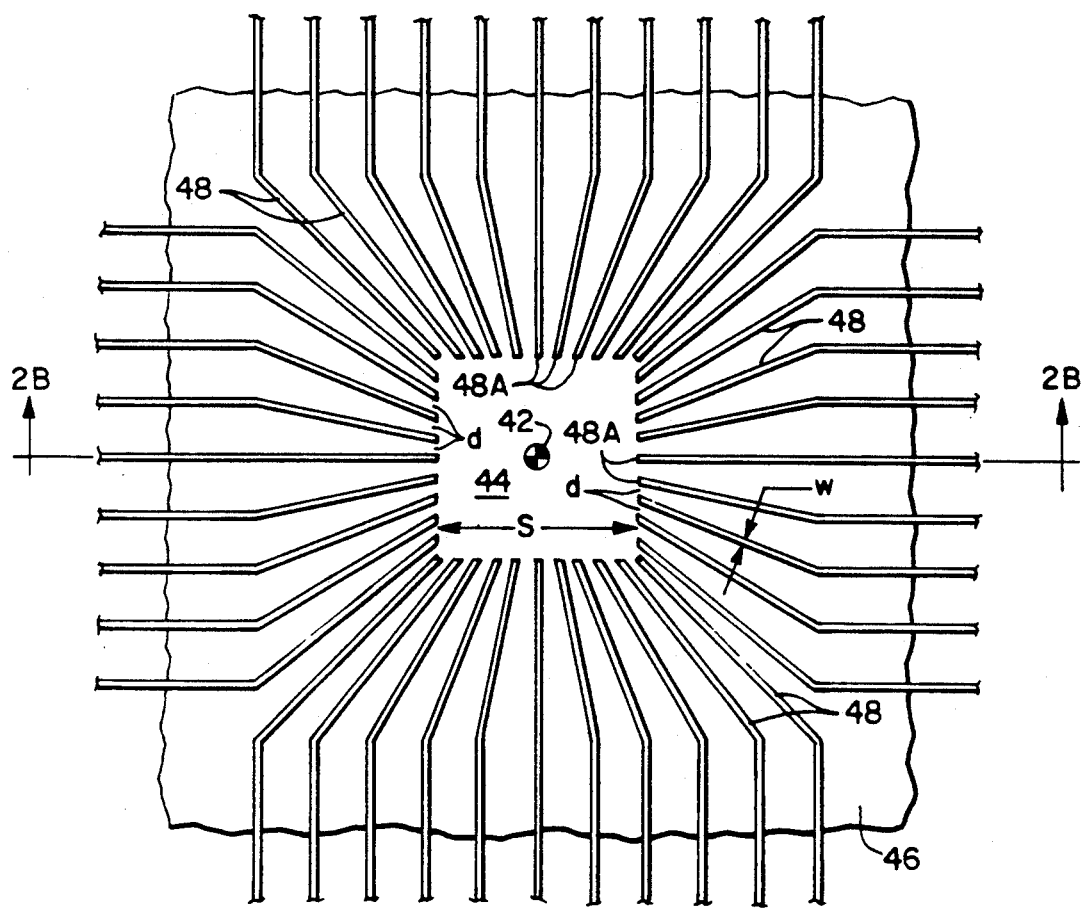
FIG. 2A is a generalized plan view of the inner lead layout of the present invention.
Figure 2B:
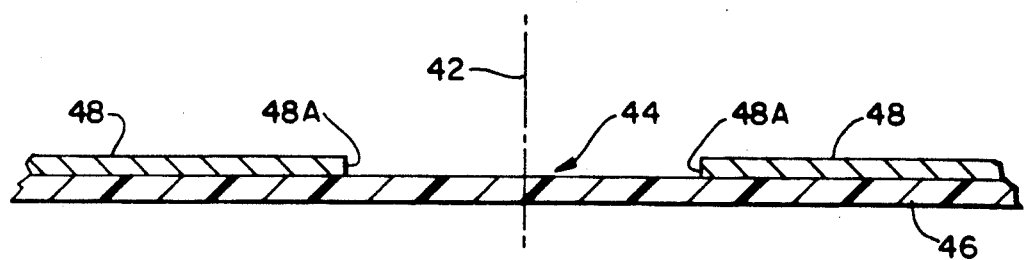
FIG. 2B is a cross-sectional view taken through FIG. 2A.

FIGS. 2A and 2B

FIGS. 2A and 2B show an embodiment of the present invention. A semiconductor device assembly includes a lower support layer 46, comparable to the lower plastic film layer 16 of FIGS. 1A–1C. In this case, the lower support layer may be a plastic film, such as KAPTON, or may be a ceramic material such as Beryllium Oxide, Aluminum Nitrate or Aluminum Nitride. Inner, conductive leads 48, comparable to the conductive leads 18 shown in FIGS. 1A–1C are disposed atop the lower support layer 46. Not shown in FIGS. 2A and 2B are an upper film layer (14), a die attach pad (20), a semiconductor die (22), bond wires (24), a dam structure (26), a gel coat (28) or an encapsulant (epoxy potting compound)—these elements having been omitted for descriptive clarity in these Figures.

As shown in these Figures, a plurality (n) of inner leads 48 radiate out from a central point 42. By way of example, the inner leads 48 each have a width (w) of $2\frac{1}{2}$ mils, and are spaced at 4 mil intervals (d) at their innermost ends 48A. (Evidently, the spacing between adjacent leads increases as the distance from the center 42 increases—the leads being arranged in an outwardly radiating "fan" pattern.)

The inner leads 48 stop short of reaching the central point 42 by a distance generally equal to s/2, where "s" is the dimension of a square opening 44 defined by the ends 48A of the inner leads 48. Actually, in order to form a generally square opening 44, the leads extend to within from s/2 to 0.7s of the center point 42 in an arithmetic progression—the leads centered along sides of the square opening 44 extending the closest (s/2) to the center point 42 and the leads at the corners of the square opening 44 extending the furthest (0.7(s)) from the center point 42.

A generalized formula is thus derived, as follows:

$$s = w(n/4) + d(n)$$

where:
s is the dimension of a side of the opening;
w is the width of a lead;
n is the total number of leads; and
d is the intra-lead spacing.

This generalized formula does not, however, take into account the fact that four of the leads 48 may be disposed exactly at the corners of the square opening.

Evidently, for a given number (n) of conductors, and given conductor widths (w) and spacings (d), a lower limit for the size of the opening (s) is readily derived.

In the examples that follow, it will be demonstrated that a single substrate configuration of inner leads 48 atop a support layer 46, defining a generally square opening 44 of fixed size, (s) by (s), can accommodate a broad range of die sizes ranging from "small" dies measuring approximately "s" on a side, to "medium" dies measuring approximately 2s on a side, to "large" dies measuring approximately 6s on a side. However, it should be appreciated that the substrate can accommodate dies smaller than the opening, limited only by the practical maximum length of bond wires.

By having a standardized substrate, and hence (ultimately) a standardized package for semiconductor device assemblies that will accommodate a broad range of die sizes, inventories will be reduced, manufacturing logistics will be simplified, design libraries and logistics will be simplified, and manufacturing costs will be lowered.

FIGS. 3A-3C

FIGS. 3A, 3B and 3C show a semiconductor device assembly 40 illustrating the inner lead layout of the present invention, with a small die 52. The inner leads are designated by the reference numeral 48, corresponding to the leads 18 of the FIGS. 1A-1C. Not shown are an upper layer (14), dam (26) gel coat (28) and potting compound, as were discussed with respect to FIGS. 1A-1C; these elements having been omitted for illustrative clarity. The die 52 is shown as connected to the leads 48 with bond wires 54, but one skilled in the art to which this invention pertains will recognize that the die could be attached to the conductive leads 48 by a TAB (tape automated bonding) process.

As shown in FIG. 2A, the inner leads 48 are arranged in a pattern, radiating outwardly from a central point 42 underneath the die 52. However, they do not extend all the way to the central point. Instead, they extend to only to a "clear" area, or opening 44. As shown in FIGS. 3A-3C, a small die 52 may be disposed at least partially within this opening so that the inner leads extend nearly (e.g. to within 5-10 mils) to the periphery of the die. Given a square die of dimension "s" along each edge, the opening 44 is generally square and has an area just greater than $s^2$.

As illustrated in this example, there are sixty four leads 48 arranged symmetrically about the opening 54, sixteen leads on each of the four sides of the opening. Typically, these leads have a width, "w", of 2½ mils, and are spaced at 4 mil intervals, "d". This means that the opening measures approximately (in this example, slightly greater than) 100 mils on a side, which is calculated as follows:

$$s = w((n/4) - 1) + d(n - 1)$$

where:
s is the dimension of a side of the opening;
w is the width of a lead;
n is the total number of leads; and
d is the intra-lead spacing.

As shown in FIGS. 3A-3C, a die 52 just smaller than the opening, for example a 100 mil × 100 mil square die, can be disposed directly atop (or within) the opening, in which case the leads 48 will extend nearly to the perimeter (edges) of the die. The die 52 is attached to the underlying support 46 (corresponding to the tape layer 16 in FIGS. 1A-1C) with a dollop 50 of non-electrically-conductive epoxy. The epoxy 50 may extend over the innermost ends of the leads 48, and is preferably thermally compatible with the substrate (leads 48 and underlying support layer 46) to avoid thermal stress. The epoxy for securing the die 52 to the substrate is suitably a B-stageable epoxy, such as RJ-4B (manufactured by RJR Polymers).

In the case of TAB bonding the die 52 to the leads 48, the leads would extend to just within (e.g. by approximately 10 mils) the perimeter of the die 52, and the die would sit entirely atop the leads, centered on the opening 44.

FIGS. 4A-4C

FIGS. 4A-4C show a semiconductor device assembly 60 similar to that of FIGS. 3A-3C, with the exception that the die 52' is larger than the opening 44. In these Figures, is a "medium" size die measuring, for example, 200 mils on each side, and the opening 44 measures approximately 100 mils on a side.

Noticeably, in this embodiment, the inner leads 48 extend substantially (e.g. from 50 mils for leads at the center of the sides of the opening 44 to 70 mils for leads at the corners of the opening 44) underneath the die 52'.

As shown in FIGS. 4A-4C, a die 52' larger than the opening, for example a 200 mil × 200 mil square die, can be disposed directly atop (or within) the opening, in which case the leads 48 will extend nearly to the perimeter (edges) of the die. As in the previous example (FIGS. 3A-3C) the die 52' is attached to the underlying support 46 with a dollop 50 of non-electrically-conductive epoxy, and the epoxy 50 may extend over the innermost ends of the leads 48.

FIGS. 5A-5C

FIGS. 5A-5B show a semiconductor device assembly 80 similar to that of FIGS. 3A-3C, with the exception that the die 52" is larger than the opening 44. In these Figures, the die is a "large" size die measuring, for example, 400 mils on each side, and the opening measures approximately 100 mils on a side.

Noticeably, in this embodiment, the inner leads 48 extend substantially (e.g. from 150 mils for leads at the center of the sides of the opening 44 to 170 mils for leads at the corners of the opening 44) underneath the die 52".

As shown in FIGS. 5A–5C, a die 52" larger than the opening, for example a 400 mil×400 mil square die, can be disposed directly atop (or within) the opening, in which case the leads 48 will extend nearly to the perimeter (edges) of the die. As in the previous example (FIGS. 3A–3C) the die 52" is attached to the underlying support 46 with a dollop 50 of non-electrically-conductive epoxy, and the epoxy 50 may extend over the innermost ends of the leads 48.

I claim:

1. A semiconductor chip assembly comprising:
   a substrate including a single non-conductive support layer having a front face and a back face, and a conductive layer having a plurality "n" of conductive leads disposed on one face of the support layer, the conductive layer having a front face and a back face, the back face of the conductive layer in contact with the front face of the support layer, the conductive leads arranged in a generally radial pattern about a central point on the support layer, each of the conductive leads having a width "w" and spaced a distance "d" from one another at their innermost ends, the conductive leads having inward lead ends, the inward lead ends forming a generally square opening of side dimension "s";
   a semiconductor die larger than the opening, having a front circuit-containing face and a back face, the back face of the die resting on the front face of the conductive leads and substantially overlapping the inward lead ends, the back face of the die secured with an adhesive to the front face of the non-conductive support layer through the opening in the conductive layer, so that the die is disposed atop and over the opening formed by the inward lead ends of the conductive leads; and
   bond wires connecting the front face of the die to the front face of the conductive leads, substantially outward of the inward lead ends.

2. A semiconductor chip assembly according to claim 1, wherein:
   the non-conductive support layer is formed of a plastic film.

3. A semiconductor chip assembly according to claim 1, wherein:
   the non-conductive support layer is formed of ceramic.

4. A semiconductor chip assembly according to claim 1, wherein:
   the conductive leads form a generally square opening having a side dimension "s"; and
   the semiconductor die has a side dimension of approximately twice "s" disposed atop the opening and connected to the leads.

5. A semiconductor chip assembly according to claim 1, wherein:
   the conductive leads form a generally square opening having a side dimension "s"; and
   the semiconductor die has a side dimension of approximately four times "s" disposed atop the opening and connected to the leads.

6. A semiconductor chip assembly according to claim 1, wherein:
   the substrate accommodates dies having a dimension ranging from smaller, to substantially equal, to approximately four times the size of the opening.

* * * * *